United States Patent

Robinson

[11] Patent Number: 5,866,913
[45] Date of Patent: Feb. 2, 1999

[54] PROXIMITY CORRECTION DOSE MODULATION FOR E-BEAM PROJECTION LITHOGRAPHY

[75] Inventor: Christopher Frederick Robinson, Hyde Park, N.Y.

[73] Assignee: International Business Machines Corporation, Armonk, N.Y.

[21] Appl. No.: 878,226

[22] Filed: Jun. 18, 1997

Related U.S. Application Data

[63] Continuation of Ser. No. 574,747, Dec. 19, 1995, abandoned.

[51] Int. Cl.[6] .................................................... H01J 37/30
[52] U.S. Cl. ............................................................ 250/492.22
[58] Field of Search ............................ 250/492.22, 492.2

[56] References Cited

U.S. PATENT DOCUMENTS

| | | | |
|---|---|---|---|
| 4,504,558 | 3/1985 | Bohlen et al. | 430/30 |
| 4,712,013 | 12/1987 | Nishimura et al. | 250/492.2 |
| 4,762,396 | 8/1988 | Dumant et al. | 430/5 |
| 4,902,899 | 2/1990 | Lin et al. | 250/492.1 |
| 4,957,835 | 9/1990 | Aden | 430/5 |
| 5,097,138 | 3/1992 | Wakabayashi et al. | 250/492.2 |
| 5,242,770 | 9/1993 | Chen et al. | 430/5 |
| 5,256,505 | 10/1993 | Chen et al. | 430/5 |
| 5,258,246 | 11/1993 | Berger et al. | 430/5 |
| 5,359,202 | 10/1994 | Yasuda et al. | 250/492.22 |
| 5,418,093 | 5/1995 | Asai et al. | 430/5 |
| 5,424,173 | 6/1995 | Wakabayashi et al. | 430/296 |
| 5,468,577 | 11/1995 | Bae | 430/5 |
| 5,508,133 | 4/1996 | Bae | 430/5 |
| 5,523,184 | 6/1996 | Hwang et al. | 430/5 |
| 5,532,496 | 7/1996 | Gaston | 250/492.22 |

FOREIGN PATENT DOCUMENTS

| | | | |
|---|---|---|---|
| 56-1653258 | 12/1981 | Japan | 430/394 |
| 1352441 | 11/1987 | U.S.S.R. | 430/30 |

OTHER PUBLICATIONS

Ismail, "A Novel Method For Submicron Structurization Using Optical Projection Lithography"; Microelectronic Engineering 1 (1983) pp. 295–300.

*Primary Examiner*—Bruce Anderson
*Attorney, Agent, or Firm*—Graham S. Jones, II

[57] ABSTRACT

A lithographic projection method which comprises projecting radiation along a transmission path and through a lens system and an opaque back focal plane filter for electrons with a transparent aperture for the projected radiation to produce a patterned image and an amount of desired radiation on a target. The transmission path includes a source of radiation of charged particles directed at a target comprising a substrate coated with resist. A pattern-defining mask that contains a plurality of subresolution scattering features thereon to produce the desired degree of scattering of the radiation is placed between the source and the target. The subresolution scattering features vary in density as an direct function of predicted proximity exposure.

28 Claims, 7 Drawing Sheets

PROXIMITY CORRECTION DOSE MODULATION FOR E-BEAM PROJECTION LITHOGRAPHY

The application is a continuation of application Ser. No. 08/574,747, filed Dec. 19, 1995, now abandoned.

BACKGROUND OF THE INVENTION

1. Field of the Invention

This invention relates to compensation for the proximity effect in the imaging patterns of electron beam projection lithography and more particularly to mask structures and a method of manufacturing such masks.

2. Description of Related Art

Terminology

To avoid ambiguity or confusion, some of the terms used in the present application are defined in the following definitions. The definitions are made as clear as possible by limiting them to simple electron beam (E-beam) lithography of integrated circuits, but analogous definitions apply to applications other than the patterning of integrated silicon circuits and to other generalizations. The specificity of these definitions is not intended to limit the generality of the invention.

Electron Beam Projection Lithography: An E-beam is directed through a mask towards an E-beam lens where it is focused onto a work piece such as a semiconductor wafer creating an image of the mask pattern on the wafer.

Transparent: Electrons pass through the material with little or no scattering.

Nontransparent: Most electrons are either absorbed in the material, scattered elastically (with little loss of energy) through large angles or scattered inelastically (with significant loss of energy) through smaller angles. The net result of these interactions and lenses and a contrast aperture downstream of the mask is that few electrons strike the target or workpiece.

Projection Mask (Reticle): A master pattern of transparent and nontransparent areas which determines that electrons hitting transparent areas will strike the target and that electrons hitting nontransparent areas will not strike the target. Usually the master pattern is projected onto the target at a significantly reduced size as the E-beam is focused to expose a smaller image area.

Scattering Mask: A projection mask in which the nontransparent areas generally scatter the electrons somewhat (add relatively small random deviations to their original vectors) instead of absorbing or reflecting them.

Scattering-mask Lithographic Projection System: An electron beam system incorporating, in sequence, an electron source, a scattering mask, a back focal plane where electrons spreading directly from the source are to be focused, and a target plane where electrons spreading directly from the scattering mask are focused. Such a system requires, as a minimum, one lens (generally in the vicinity of the scattering mask) to focus the source at the back focal plane, and one lens (generally in the vicinity of the back focal plane) to focus the mask at the target.

Back Focal Plane Filter: A mask of transparent and non-transparent areas. The filter is placed at a plane where the original electron source is imaged. Such a filter can be designed to pass, scatter or block electrons striking it in different places.

Target: A silicon wafer coated with a "resist" material that becomes more easily removed from certain areas of the wafer when it is developed (dissolved) after exposure of those areas to an electron beam. Thus, after chemical processing the resist material is entirely removed from all areas of the target where the exposure by the projected electron beam was sufficiently intense. Because of uncontrollable variations in the "chemical processing" faithful reproduction of the intended pattern is possible only when there is a significant difference between minimum exposure in areas intended to be exposed and the maximum exposure in areas intended to remain unexposed.

Backscattering: Electrons impact upon the top surface of a silicon target covered with resist at various points of incidence on that surface. The electrons are scattered within the silicon of the target so that they re-emerge from the surface of the silicon and produce additional resist exposure at a significant distance from the original impact point. The accelerating voltage applied to the electrons before they strike the target has a significant effect on the backscatter distribution profile, which may extend only a few micrometers or tens of micrometers from the impact point.

Proximity Effect: A pattern-dependent variation in general exposure levels. Electrons pass through a layer of resist on the top surface of a silicon substrate target striking the underlying silicon substrate. Some of those electrons are scattered back upward, producing additional exposure of the resist by the electrons on their second pass. Because the backscattered electrons typically spread over an area much larger than a minimum-size pattern feature, an isolated spot may get only 5% or less additional exposure; however, accumulated backscattering from many adjacent spots can increase effective resist exposure by 80% or more.

Using those nominal percentages and assuming that direct exposure is 100 units, it is seen that large exposure areas receive 180 units, small unexposed areas in the middle of such large exposed areas receive 80 units, and small isolated exposed areas receive 105 units of exposure. That 105-to-80 difference is not a comfortable margin for process control. The proximity effect causes dense pattern areas to be overexposed and/or sparse pattern areas to be underexposed.

Blockout regions: Large 2 mm square transparent areas of the mask which result in 500 microns square (0.5 mn square) exposed features on the silicon wafer after 4:1 reduction, leaving a large opening with all resist removed.

Clean (Clear): Refers to exposed areas on the wafer from which all resist is removed by the development process.

U.S. Pat. No. 4,712,013 of Nishimura et al for "Method of Forming a Fine Pattern with Charged Particle Beam" describes a method for forming fine patterns having dual exposure. In a first exposure an exposed pattern is formed with a charged beam E-Beam (Electron-beam) exposure. The second (auxiliary) exposure floods the entire device in a non-pattern exposure with either a charged beam or an electromagnetic wave selected from an E-beam, an ultra-violet (UV) or far UV ray or an X-ray. The auxiliary exposure can be performed at a high voltage such as a voltage of more than 30 KeV.

U.S. Pat. No. 4,504,558 of Bohlen et al for "Method of Compensation of Proximity Effect in Electron Beam Projection Systems" describes compensation of proximity effects by following a first E-beam exposure step with a second exposure step to expose selected areas in the second exposure step. The proximity effect is used with complementary masks. The developing process of the photoresist is discontinued prematurely. Asymmetrical ridge edges are detected by viewing them under a microscope. The line width of the narrower ridge is measured, thereby obtaining the proximity effect range.

Japanese abstract No. JP56-165325 (A) of Nishizawa describes formation of a pattern using sequential exposure levels by shifting the photomask relative to the workpiece coated with photoresist. Each exposure is made with energy less than "proper", but the overlap provides a level of exposure which is proper and when the resist is developed the process yields the selected pattern.

Ismail "A Novel Method for Submicron Structurization Using Optical Projection Lithography" in *Microelectronic Engineering* 1 (1983) pp 295–300 describes an optical projection method for exposing a very small feature by a multiple (double) exposure when exposing the regions of an unexposed resist layer to be patterned during each exposure with a level of optical energy below the energy level needed to expose the whole resist thickness.

The above references illustrate a problem which requires a solution, which is that multiple exposure steps have been required to achieve the desired results. It is an object of this invention to achieve the objectives achieved by the above processes with a new process employing a single exposure step.

U.S. patent application Ser. No. 355,887, now U.S. Pat. No. 5,532,496 of Gaston for "Proximity Effect Compensation in Scattering-Mask Lithographic Projection Systems and Apparatus Therefore" describes an alternative single step method that uses the electrons scattered outside of the normal acceptance angle of the simple contrast aperture of a scattering mask E-beam projection lithography system. Several different kinds of back focal plane filters allow one to tailor the amount of scattered electron signal that is passed to the target. However, the proximity correction cannot be optimized on an individual feature by feature basis. The mesh size over which the correction must be averaged out is equal to the exposure subfield size. Since throughput considerations will keep this subfield size reasonably large, significant compromises in proximity correction optimization must be made. As contrasted with Gaston, the present invention decouples the proximity mesh size and the exposure subfield size, permitting feature by feature optimization of the proximity corrections.

U.S. Pat. No. 5,256,505 of Chen et al for "Lithographical Mask for Controlling the Dimensions of Resist Patterns" relates to a lithography mask with intensity modulation lines with dimensions below the resolution capability of the tool. The lines have the effect of reducing exposure in the center of large features. Since the lines have dimensions (sizes) below the resolution capability of the tool they are not seen in the final image.

U.S. Pat. No. 4,902,899 of Lin et al for "Lithographic Process Having Improved Image Quality" relates to an improved image quality by having a plurality of elements in the mask which have dimensions below the resolution capability of the tool. They are employed to control the transmittance area of the mask.

U.S. Pat. No. 5,256,505 of Chen et al and U.S. Pat. No. 4,902,899 of Lin et al are very specifically addressed to optical lithography problems. The only mention of particle beam lithography is a very general statement at Col. 4 (lines 47–51) of Chen et al. Sub-resolution shapes are implemented here to address nominal energy differences received by specific shapes in optical lithography. Those references are different from the present invention which combats the classic E-beam proximity effect which is based on the neighborhood of the exposed feature and intensity variations due to scattered electrons as is explained below.

SUMMARY OF THE INVENTION

The problem solved by the invention is feature specific, local dose modulation within a subfield which is not possible in a reticle projection system by using variable beam on times. This invention provides for modulation of transparency of a scattering reticle in an E-beam reduction projection lithography system by covering transparent (weakly scattering) areas with a pattern of subresolution (e.g. dot) (strongly scattering) features of variable density.

Additional Terminology

In accordance with this invention use is made in the mask of subresolution scattering features which are defined as follows:

Subresolution Scattering Features (SSF): Reticle features smaller than the smallest features which can be resolved at the target. A uniform distribution of such features on the reticle has the net effect of reducing the exposure dose in the corresponding area at the target.

An E-beam maskmaker can address exposure regions sufficiently small so they are not capable of being resolved by the subsequent wafer exposure/process. In the current state of the art, a maskmaker tuned for sharp 400 nm images can nevertheless expose 100 nm features. These will be out of focus and marginally resolved after reticle processing. Rather than 100 nm squares, they will likely be gaussian round shapes with diameters on the order of 100 nm. After the 4:1 reduction of wafer exposure, 400 nm features will become well defined 100 nm features but the 100 nm reticle scattering features disappear. They are too small to be resolved by the wafer exposure/develop process in the current state of the art. As the state the art improves the SSF's would scale down in size with the nominal feature sizes. Accordingly, the same problem will exist and the same solutions provided will apply with smaller dimensions. In accordance with the present invention, I have discovered that this characteristic of an E-beam maskmaker can be used to advantage by incorporating in the mask an array of SSF features, i.e. features smaller than the smallest features which can be imaged at the target. A uniform distribution of such SSF features has the net effect of reducing the exposure dose in the corresponding area at the target to a degree dependent upon the density of SSF's.

In accordance with this invention, a lithographic projection method comprises projecting radiation along a transmission path and through a lens system and an opaque back focal plane filter for electrons with a transparent aperture for the projected radiation to produce a patterned image and an amount of desired radiation on a target, the transmission path. The steps of the invention include directing a source of radiation of charged particles at a target comprising a substrate coated with resist; and placing between the source and the target a pattern-defining mask that contains patterns elements including a plurality of subresolution scattering features thereon to produce the desired degree of scattering of the radiation. The subresolution scattering features vary in density as an direct function of predicted proximity exposure.

Preferably, a number N of the subresolution scattering features comprise:

$$N = (1-D)\left(\frac{1w}{Z^2}\right)$$

with a spacing x in the x-direction and a spacing y in the y-direction comprising:

$$x = \frac{w}{N_x + 1}$$

$$y = \frac{w}{N_y + 1}$$

Preferably, the subresolution scattering features are used to create test patterns using dose modulation.

Preferably, the test patterns comprise a develop monitor test pattern.

Preferably, the pattern-defining mask comprises a wafer thin silicon substrate with a top surface covered with a thin transparent membrane. The plurality of subresolution scattering features formed on said membrane comprise a thin metal film.

Preferably, the thin metal film comprises a metal selected from the group consisting of gold, chromium, tungsten, tantalum, and combinations of layers thereof.

Preferably, the metal has a thickness sufficient to be nontransparent.

Preferably, the subresolution scattering features are used to create test patterns using dose modulation.

Preferably, the test patterns comprise a develop monitor test pattern.

Preferably, the membrane comprises a material selected from the group consisting of silicon, silicon nitride, silicon carbide, and diamond, and the membrane has a thickness between about 100 nm and about 2000 nm.

Further in accordance with this invention, a lithographic projection mask adapted for use in a system of projecting radiation along a transmission path and through a lens system and a back focal plane filter for electrons contains a filter that is transparent to the projected radiation to produce a patterned image and an amount of desired radiation on a target, the transmission path including;

a source of radiation of charged particles directed at a target comprising a substrate coated with resist, a pattern-defining mask that contains pattern elements including a plurality of subresolution scattering features thereon provided to produce the desired degree of scattering in the radiation between the source and the target, the subresolution scattering features varying in density as an direct function of predicted proximity exposure.

Preferably, the mask includes a number N of the subresolution scattering features which comprise:

$$N = (1-D)\left(\frac{1w}{Z^2}\right)$$

with a spacing x in the x-direction and a spacing y in the y-direction comprising:

$$x = \frac{w}{N_x + 1}$$

$$y = \frac{w}{N_y + 1}$$

Preferably, the subresolution scattering features are used to create test patterns using dose modulation.

Preferably, the test patterns comprise a develop monitor test pattern.

Preferably, the pattern-defining mask comprises a wafer thin silicon substrate with a top surface covered with a thin transparent membrane. The plurality of subresolution scattering features formed on said membrane comprise a thin metal film.

Preferably, the thin metal film comprises a metal selected from the group consisting of gold, chromium, tungsten, tantalum, and combinations of layers thereof.

Preferably, the metal has a thickness sufficient to be nontransparent.

Preferably, the subresolution scattering features are used to create test patterns using dose modulation.

Preferably, the test patterns comprise a develop monitor test pattern.

Preferably, the membrane comprises a material selected from the group consisting of silicon, silicon nitride, silicon carbide, and diamond, and the membrane has a thickness between about 100 nm and about 2000 nm.

BRIEF DESCRIPTION OF THE DRAWINGS

The foregoing and other aspects and advantages of this invention are explained and described below with reference to the accompanying drawings, in which:

FIG. 9A shows the pattern of a mask feature which is transparent in that 100% of the electrons in a beam pass through the material with little or no scattering.

FIG. 9B shows the pattern of a mask feature which is 99% transparent in that 99% of the electrons in a beam pass through the material with little or no scattering.

FIG. 9C shows the pattern of a mask feature which is 98% transparent in that 98% of the electrons in a beam pass through the material with little or no scattering.

FIG. 9D shows the pattern of a mask feature which is 80% transparent in that 80% of the electrons in a beam pass through the material with little or no scattering. As can be seen in this case, there are many more subresolution scattering elements in the pattern of this mask feature.

DESCRIPTION OF THE PREFERRED EMBODIMENT

This invention provides a method for patterning a mask in E-beam lithography and a mask and an E-beam exposure system formed by the method of this invention. The following algorithm is employed in performing the process.

Algorithm for Determining Size and Placement of Subresolution Scattering Features (SSF's) Used for Dose Modulation D≡Desired Dose (relative to 1.0 or 100%)
l≡Length of Macroscopic Pattern Feature
w≡Width of Macroscopic Pattern Feature
Z≡Nominal length≡width of SSF
$R_A$≡Aspect Ratio of Macroscopic Pattern Feature
N≡Total Number of SSF's Required
$n_x$≡Number of SSF's in x direction
$n_x$≡Number of SSF's in y direction
$N_x$≡$n_x$ rounded up to next number
$N_y$≡$n_y$ rounded up to next number
$Z_c$≡Corrected length≡width of SSF
x≡x spacing of SSF
y≡y spacing of SSF $$N = (1-D)\left(\frac{lw}{Z^2}\right)$$

$$R_A = \frac{\frac{l}{2Z}-1}{\frac{w}{2Z}-1}$$

$$R_A\, n_x = n_y$$

$$n_x\, n_y = N \longrightarrow R_A\, n_x^2 = N$$

$$n_x = \sqrt{\frac{N}{R_A}} \xrightarrow{\text{Round up}} n_x, n_y \longrightarrow N_x, N_y$$

$$Z_c = \sqrt{\frac{n_x, n_y}{N_x, N_y}} \cdot Z$$

$$x = \frac{w}{N_x+1}$$

$$y = \frac{w}{N_y+1}$$

$Z_c$, x and y define size and spacings of SSF's required for desired dose modulation.

Example I

Macroscopic Pattern Feature is a rectangle with dimensions of w=1600 nm by l=2400 nm on the projection mask. The objective is to reduce the dose to 93% of the base dose with a nominal SSF size of 50 nm.

$$N = (1-.93)\left(\frac{(1600\ nm)(2400\ nm)}{(50\ nm)^2}\right) = 108$$

$$R_A = \frac{\frac{2400\ nm}{100\ nm}-1}{\frac{1600\ nm}{100\ nm}-1} = \frac{23}{15} = 1.53$$

$$n_x = \sqrt{\frac{108}{1.53}} \longrightarrow 8.40 \longrightarrow N_x = 9$$

$$n_y = R_A\, N_x = (1.53)(8.40) = 12.9 \longrightarrow N_y = 13$$

$$Z_c = \sqrt{\frac{n_x, n_y}{N_x, N_y}} \cdot Z = \frac{(8.40)(12.9)}{(9)(13)}(50\ nm) = 48\ nm$$

$$x = \frac{w}{N_x+1} = \frac{1600\ nm}{10} = 160\ nm$$

$$y = \frac{w}{N_y+1} = \frac{2400\ nm}{14} = 171\ nm$$

Figure 7:
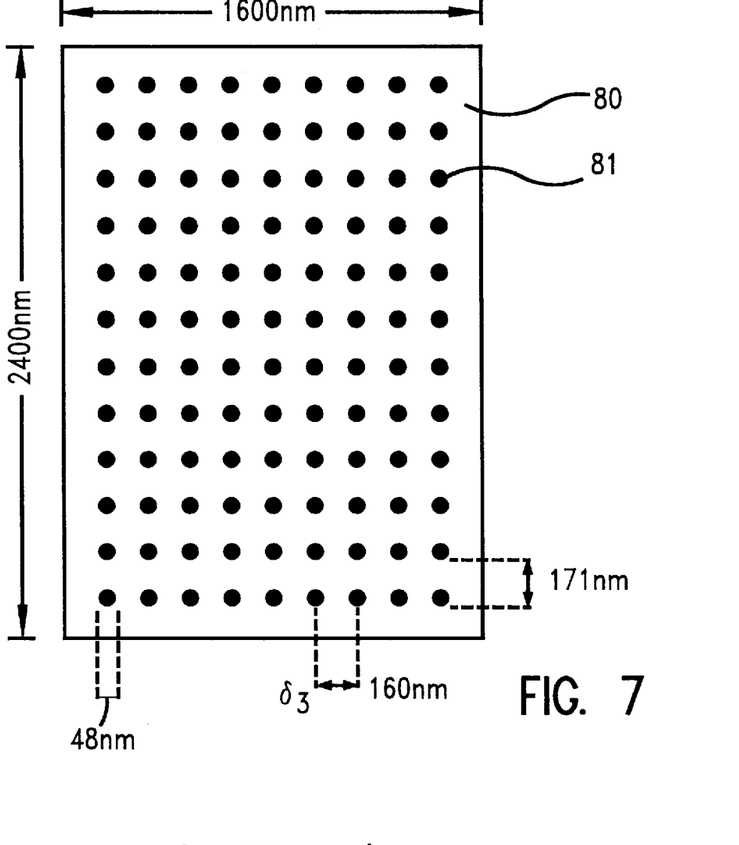
FIG. 7 shows a pattern feature containing an array of round scattering elements in the form of round dots.

Thus an array of 48 nm×48 nm SSF's on 160 nm centers in the width direction and 171 nm in the length direction is incorporated inside the 1600 nm×2400 nm mask feature as shown in FIG. 7.

Example II

Macroscopic Pattern Feature is a w=400 nm by l=1200 nm rectangle on the projection mask. The objective is to reduce the dose to 99% of the base dose with a nominal SSF size of 50 nm.

$$N = (1-.99)\left(\frac{(400\ nm)(1200\ nm)}{(50\ nm)^2}\right) = 1.92$$

$$R_A = \frac{\frac{1200\ nm}{100\ nm}-1}{\frac{400\ nm}{100\ nm}-1} = \frac{11}{3} = 3.67$$

$$n_x = \sqrt{\frac{1.92}{3.67}} \longrightarrow 0.72 \longrightarrow N_x = 1$$

$$n_y = R_A\, N_x = (3.67)(0.72) = 2.65 \longrightarrow N_y = 3$$

-continued $$Z_c = \sqrt{\frac{n_x, n_y}{N_x, N_y}} \cdot Z = \frac{(0.72)(2.65)}{(1)(3)} (50 \, nm) = 40 \, nm$$

$$x = \frac{w}{N_x + 1} = \frac{400 \, nm}{2} = 200 \, nm$$

$$y = \frac{w}{N_y + 1} = \frac{1200 \, nm}{4} = 300 \, nm$$

Figure 8:
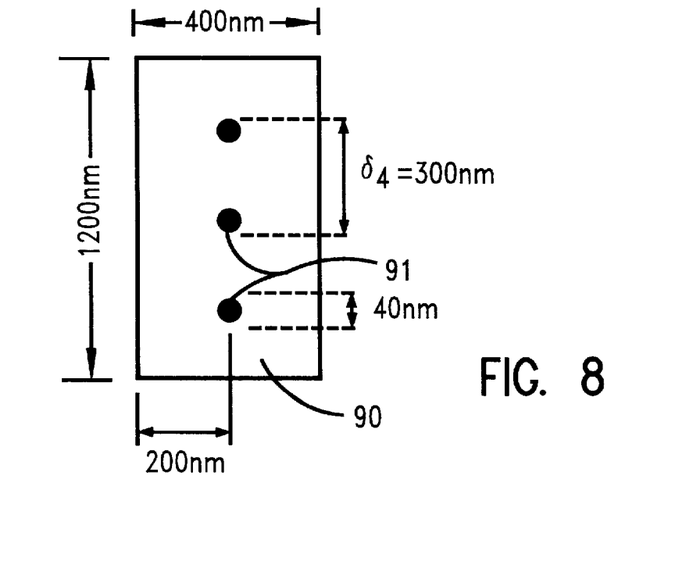
FIG. 8 shows another pattern feature containing an array of round scattering elements in the form of round dots.

In this case a string of 40 nm SSF's centered in the width direction and on 300 nm centers in the length direction in the macroscopic pattern feature achieves the desired dose reduction, as shown in FIG. 8.

Figure 1:
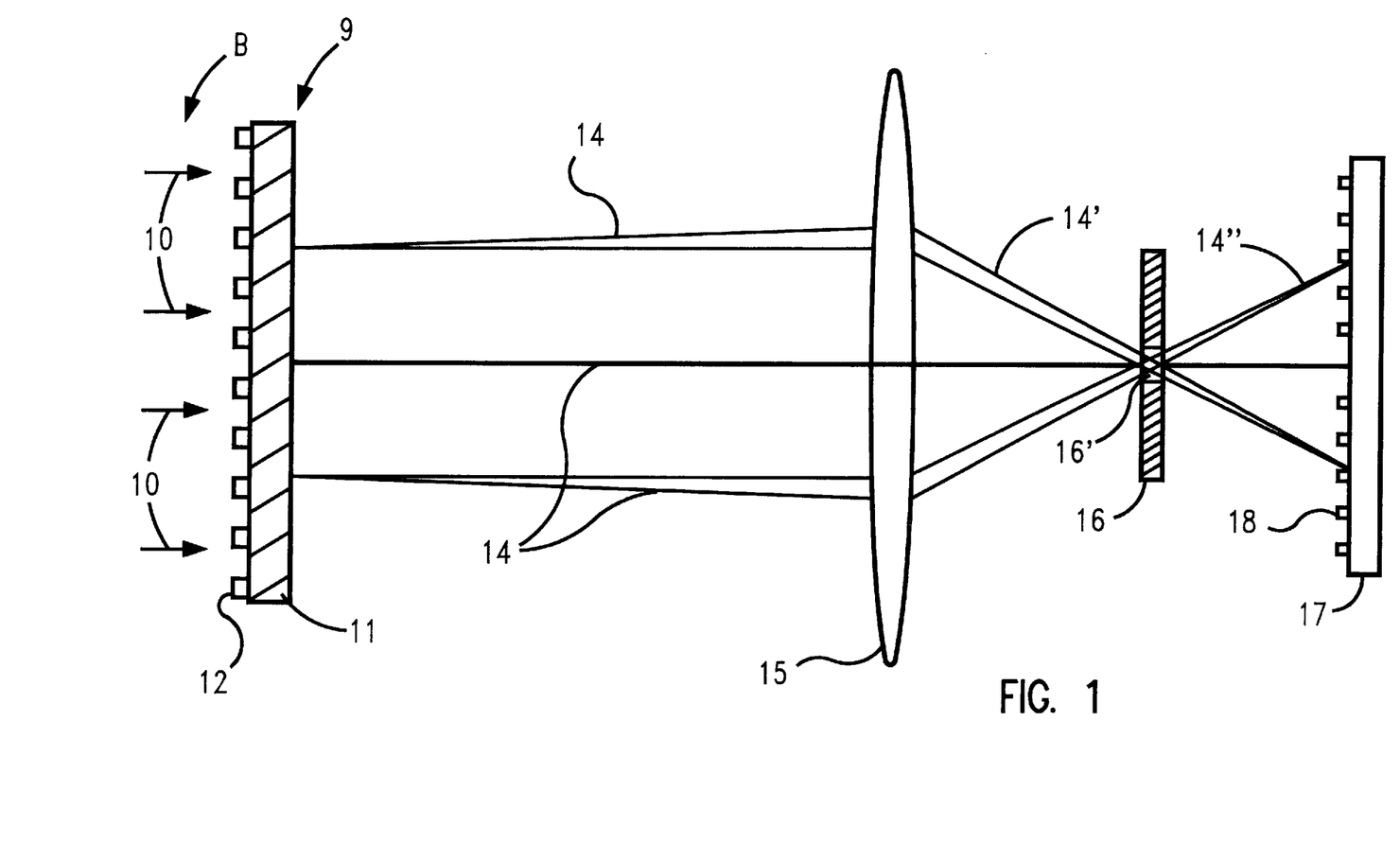
FIG. 1 is a schematic diagram illustrating a SCALPEL (Scattering Angle Limited Projection E-beam Lithography) system.

FIG. 1 is a schematic diagram illustrating a SCALPEL (SCattering Angle Limited Projection E-beam Lithography) system. A beam B of electrons 10 is directed towards a scattering mask 9 including a thin membrane 11 having a thickness between about 1,000 Å and about 20,000 Å (0.1 $\mu$m and about 2 $\mu$m thick.) The membrane 11 is composed of a material which is transparent to the electron beam B composed of electrons 10. That is to say that electrons 10 in beam B are to pass through membrane 11 freely in the absence of any other object providing an obstruction to the path of electrons 10 in the beam B as they pass from the source of the beam through the membrane 11. Formed on the side of the membrane 11, facing the beam 10, is a pattern of high density scattering elements 12 (SSF's) to provide a contrast mechanism that enables reproduction of the mask pattern at the target surface. The scattering elements 12 are patterned in the composite shape which is to be exposed upon a work piece 17 which is coated with E-beam sensitive resist, which as shown in FIG. 1 has been processed into pattern elements 18. The electrons 10 from the E-beam B which pass through mask 9 are shown by beams 14 which pass through electromagnetic lens 15 which focuses the beams 14 through an aperture 16' in an otherwise opaque back focal plane filter 16. The aperture 16' permits only electrons scattered through small angles to pass through to the work piece 17.

Figure 2A:
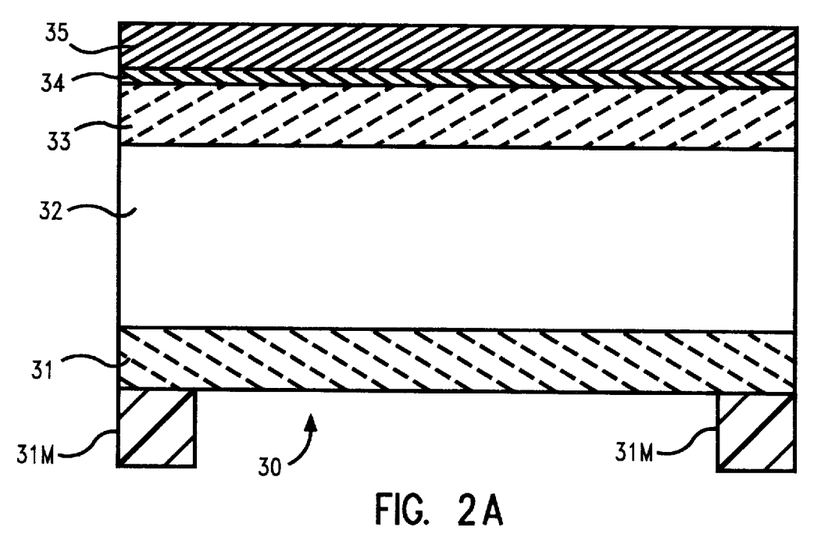
FIG. 2A shows a mask in accordance with this invention in an early stage of fabrication with a wafer thin silicon substrate with smooth top and bottom surfaces coated with thin silicon nitride films with the upper film coated with thin chromium and tungsten films.

FIG. 2A shows a mask 30 in an early stage of fabrication with a wafer thin silicon substrate 32 with smooth top and bottom surfaces coated with thin silicon nitride films 33 on top and film 31 on the bottom having a thickness of about 100 nm formed by LPCVD on the top and bottom surfaces of substrate 32. On top of upper silicon nitride film 33 is formed a thin metal (preferably chromium) film 34 having a thickness of about 10 nm. The top surface of chromium film 34 is coated with a thin tungsten film 35 having a thickness of about 50 nm. On the bottom of layer 31 is formed a photoresist mask 31M which is used to form a window in the backside of the mask as shown in FIG. 2B.

Figure 2B:
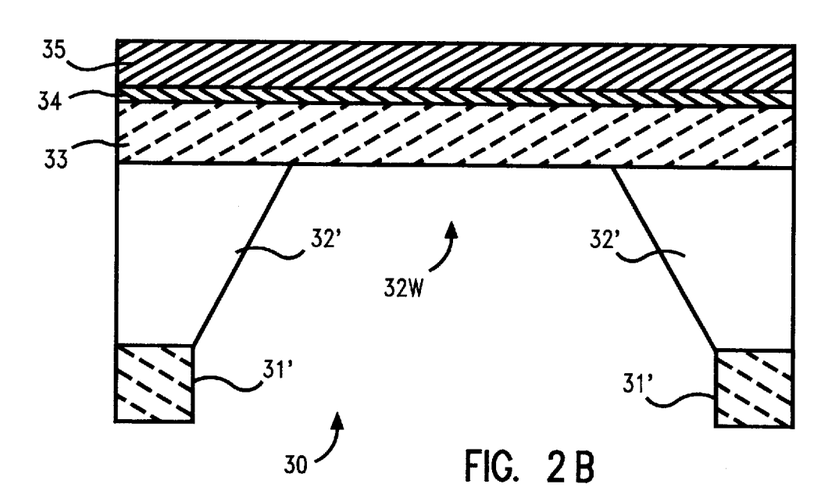
FIG. 2B shows the mask of FIG. 2A after a window has been etched through the lower silicon nitride film forming therefrom a ring about the periphery of the mask. The silicon substrate has been etched leaving a silicon frame beneath the periphery of the silicon nitride membrane.

FIG. 2B shows the mask 30 of FIG. 2A after a window 32W has been etched using mask 31' through silicon nitride film 31 and silicon substrate 32. The etching of layer 31 forms therefrom a ring 31' about the periphery of the mask 30. In addition the silicon substrate 32 has been etched by EDP leaving a silicon frame 32' beneath the periphery of silicon nitride film 33 which because of the etching becomes a membrane 33.

Figure 2C:
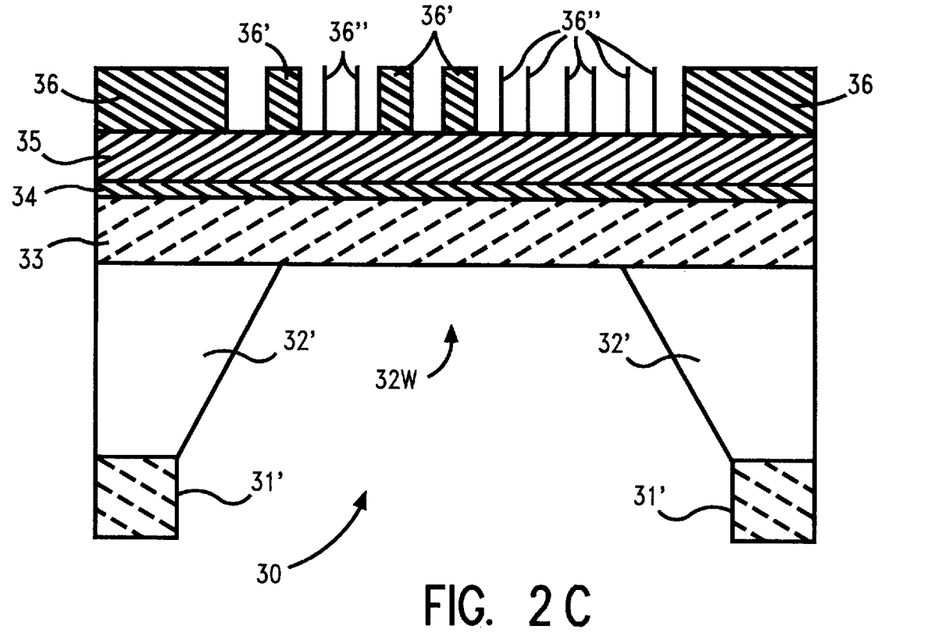
FIG. 2C shows the mask of FIG. 2B after a photoresist mask has been formed on the top of the mask with a number of wide elements and narrow elements which are so narrow as to be subresolution features of the kind employed in accordance with this invention.

FIG. 2C shows the mask 30 of FIG. 2B after a photoresist mask 36 has been formed on the top of the mask 30 with a number of wide elements 36' and narrow elements 36". The narrow elements 36" (located between the two wide elements 36' or between a wide element 36' and the border of unexposed resist 36) are so narrow as to be subresolution features of the kind employed in accordance with this invention.

Figure 2D:
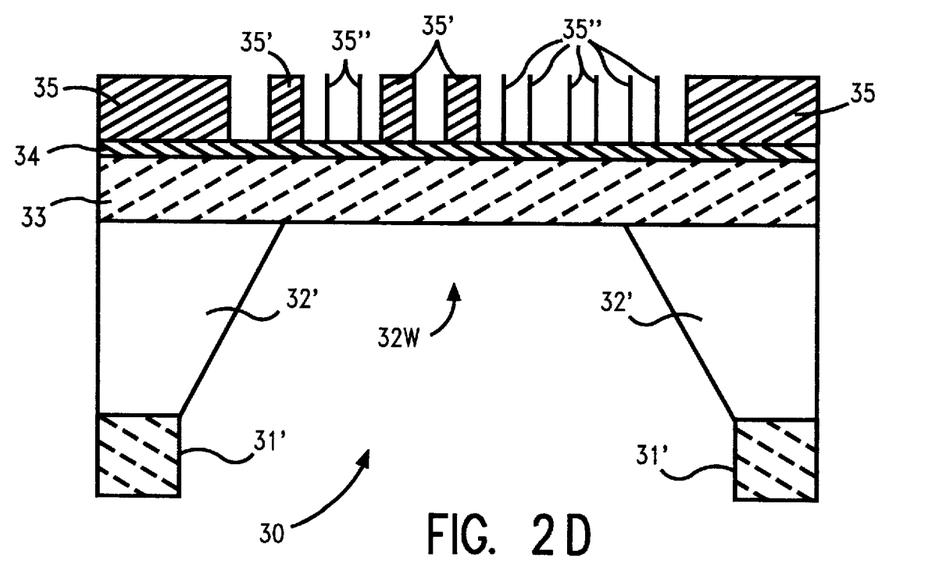
FIG. 2D shows the reticle of FIG. 2C after the photoresist mask with wide elements and narrow elements has been used to etch down into tungsten layer in the same pattern of wide and narrow elements beneath other wide and narrow elements. When the mask is used, with the elements, the net dose of electrons which can pass therethrough is reduced by the elements which absorb electrons in the beam.

FIG. 2D shows the reticle 30 of FIG. 2C after the photoresist mask 36 with wide elements 36' and narrow elements 36" have been used to etch down into tungsten layer 35 in the same pattern of wide elements 35' and narrow elements 35" beneath wide elements 36' and narrow elements 36". When the mask is used, with the elements 35", the net dose of electrons which can pass through the layer 34 and membrane 33 is reduced by the elements 35" which scatter some of the electrons in the beam.

Alternatively, the thin silicon nitride membrane 33 could be a silicon, a silicon carbide, or a diamond membrane. The chromium and tungsten SSF's could alternatively be replaced with SSF's composed of gold, tantalum, tungsten, and other metals.

Figures 3A, 3B:
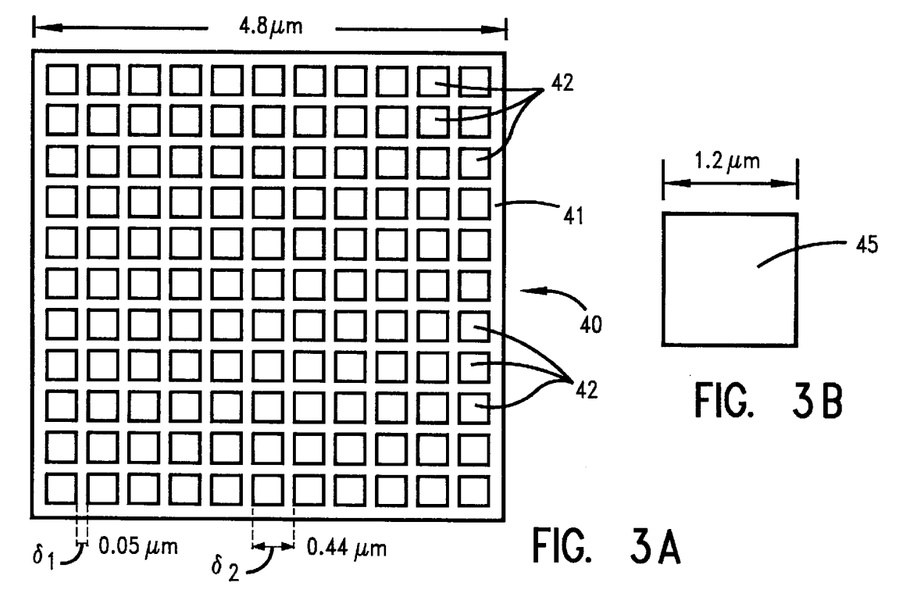
FIG. 3A shows a stencil mask embodiment of this invention. The reticle feature includes dose modulation through incorporation of an unresolvable lattice. The lattice work comprises a grid of scattering elements having a width $\delta_1$ of less than or equal to 0.05 μm. The lattice work surrounds a plurality of windows each having a width $\delta_2$.
FIG. 3B shows the resultant wafer feature using he mask of FIG. 3A.

FIG. 3A shows a stencil mask embodiment of this invention. The reticle feature 40 includes dose modulation through incorporation of an unresolvable lattice. The lattice work 41 comprises a grid of scattering elements having a width $\delta_1$ of less than or equal to 0.05 $\mu$m. The lattice work 41 surrounds a plurality of windows 42 with a width $\delta_2$.

FIG. 3B shows the resultant wafer feature 45 which is 1.2 $\mu$m square after a 4:1 reduction. It received 80% of the nominal dose using the reticle feature 40.

Figures 4A, 4B:
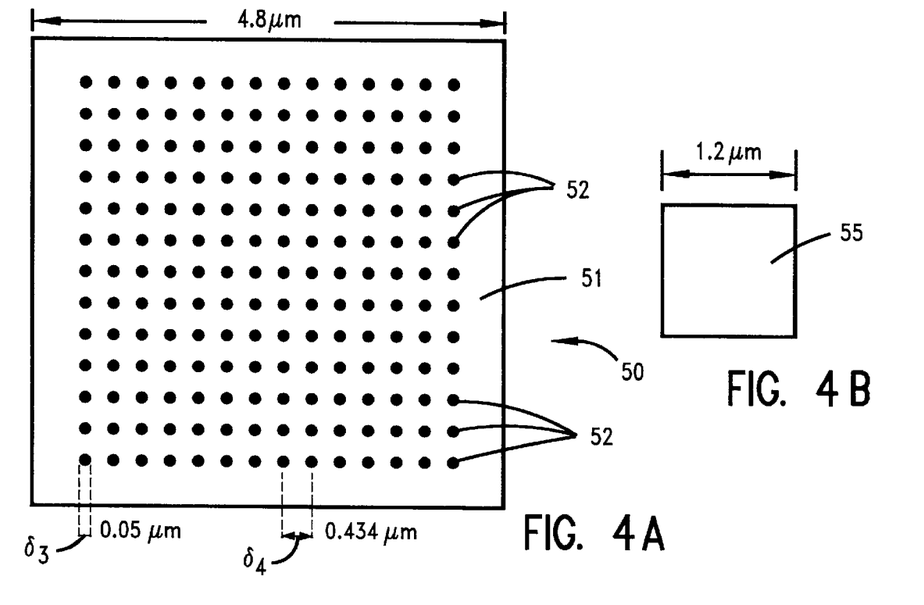
FIG. 4A shows a SCALPEL mask embodiment of this invention including a reticle feature with a dose modulation through incorporation of subresolution scattering features. The SSF's which are uniformly distributed over the reticle feature do not absorb the electrons, but scatter them sufficiently such that they are not passed through the back focal plane filter (contrast aperture.)
FIG. 4B shows the resultant wafer feature using the mask of FIG. 4A.

FIG. 4A shows a SCALPEL mask embodiment of this invention. The reticle feature 50 includes dose modulation through incorporation of subresolution scattering features 52. The SSF's 52 which are uniformly distributed over the reticle feature 50 does not absorb the electrons, but scatters them sufficiently such that they are not passed through the back focal plane filter (contrast aperture.)

FIG. 4B shows the resultant wafer feature 55 which is a 1.2 $\mu$m square after 4:1 reduction. It has received 98% of the nominal dose using the reticle feature 50.

Figure 5:
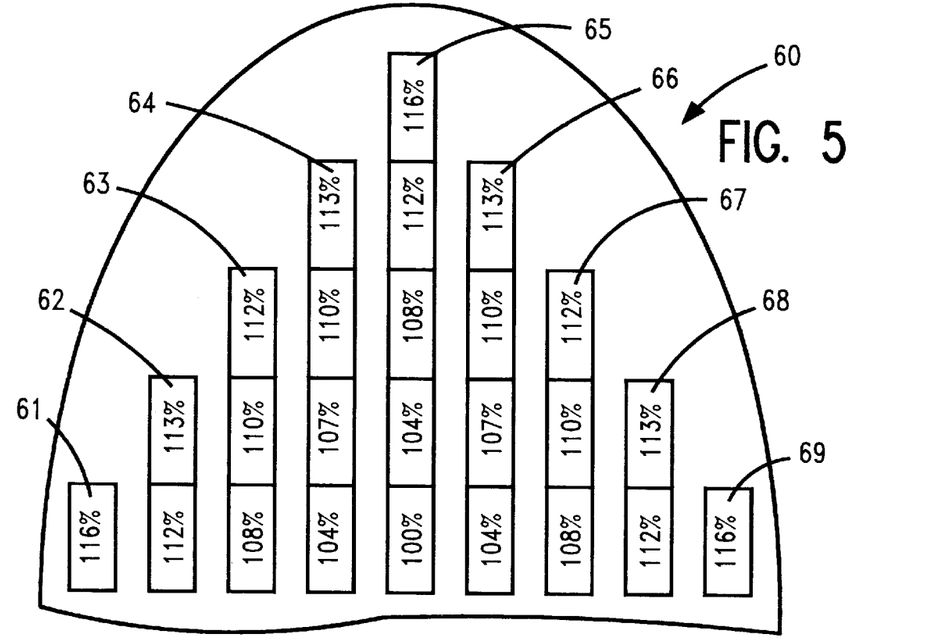
FIG. 5 shows a portion of a proximity corrected E-beam lithography pattern from a probe writing system embodying a dose boost technique.

FIG. 5 shows a portion of a proximity corrected E-beam lithography pattern from a probe writing system embodying a dose boost technique where exposed, variable length stripes 61, 62, 63, 64, 65, 66, 67, 68 and 69 are shown arranged in a parallel array 60 with a plurality of rectangular regions in each with varying exposure dose levels from a level of 100% at the center to a level of 116% at the distal portions of some of the stripes 61–69. The maximum dose is 116% at the periphery in the top rectangular region of stripe 65 as well as stripes 61 and 69. The central region is exposed to a 100% dose at the bottom of stripe 65. The central 100% dose in stripe 65 receives the most effect of scattering from near neighbors, since it is in the center of the pattern array 60. The dose boost in other rectangles is intended to equalize the net dose over the array.

Figure 6:
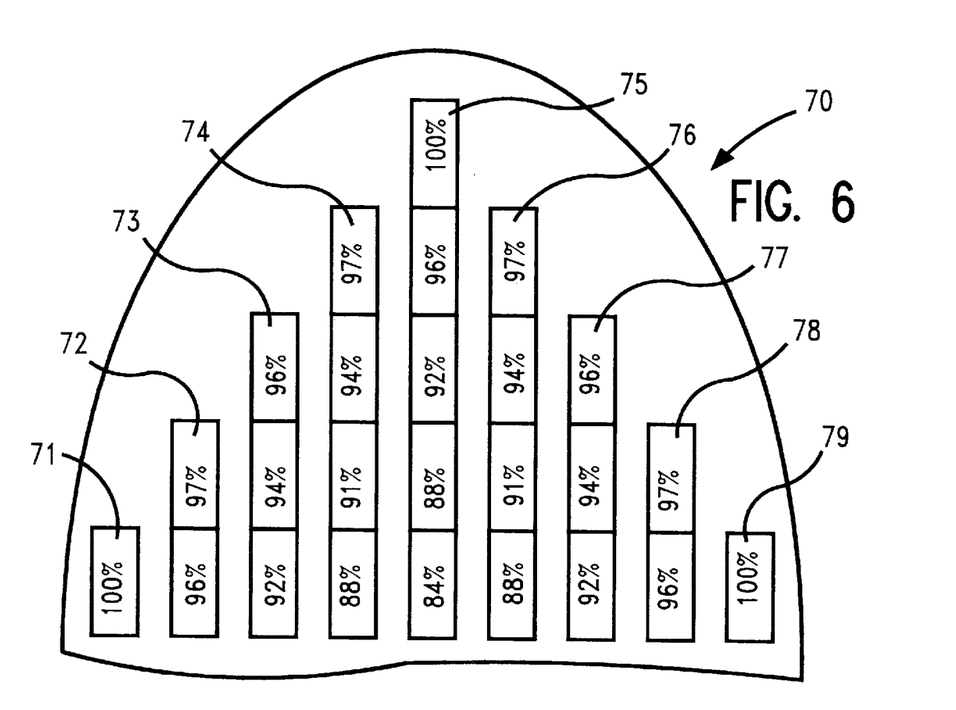
FIG. 6 shows a proximity corrected projection E-beam lithography pattern embodying a dose reduction technique.

FIG. 6 shows a proximity corrected projection E-beam lithography pattern embodying a dose reduction technique where exposed, variable length stripes 71, 72, 73, 74, 75, 76, 77, 78 and 79 are shown arranged in a parallel array 70 with a plurality of rectangular regions in each with varying exposure dose levels from the level of 84% at the center to the level of 100% at the distal portions of some of the stripes 71–79. The maximum dose is 100% at the periphery in the top rectangular region of stripe 75 as well as the stripes 71 and 79. The central region is exposed to 84% dose at the bottom of stripe 75. The central 84% dose in stripe 75 receives the most effect of scattering from near neighbors since it is in the center of the pattern array 70. The dose reductions in rectangles with more proximity exposure are intended to equalize the net dose over the array.

In FIG. 7, a pattern feature 80 contains an array of 9 columns of 12 round scattering elements in the form of round dots 81 having a diameter of 48 nanometers (nm)

which are spaced apart a distance $\delta_3$=160 nm horizontally and spaced apart a distance of 171 nm vertically. The pattern feature 80 has the dimensions of 1600 nm horizontally by 2400 nm vertically.

In FIG. 8, a pattern feature 90 contains an array of 1 column of 3 round scattering elements in the form of round dots 91 having a diameter of 40 nanometers (nm) which are spaced apart a distance $\delta_4$=300 nm vertically. The pattern feature 90 has the dimensions of 400 nm horizontally by 1200 nm vertically.

FIGS. 9A–9D illustrate the variation in the density of scattering elements in accordance with this invention on several different mask features, but are not exact representations of actual mask features.

Figure 9A:
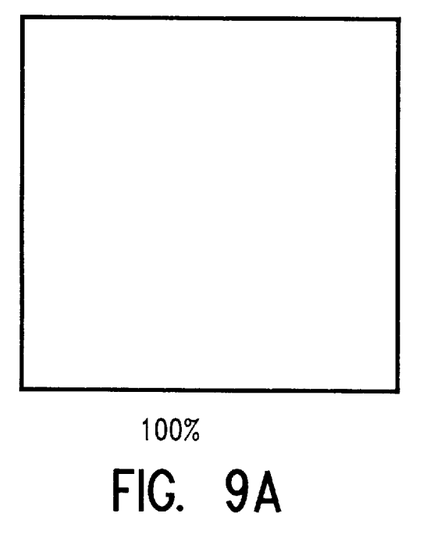
FIGS. 9A–9D illustrate the variation in the density of scattering elements in accordance with this invention on several different mask features.

FIG. 9A shows the pattern of a mask feature which is transparent in that 100% of the electrons in a beam pass through the material with little or no scattering.

Figure 9B:
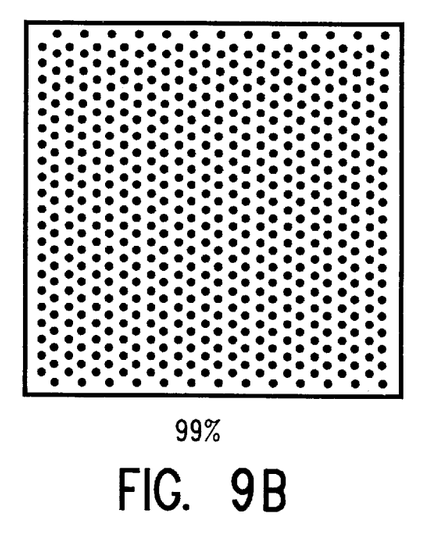

FIG. 9B shows the pattern of a mask feature which is 99% transparent in that 99% of the electrons in a beam pass through the material with little or no scattering.

Figure 9C:
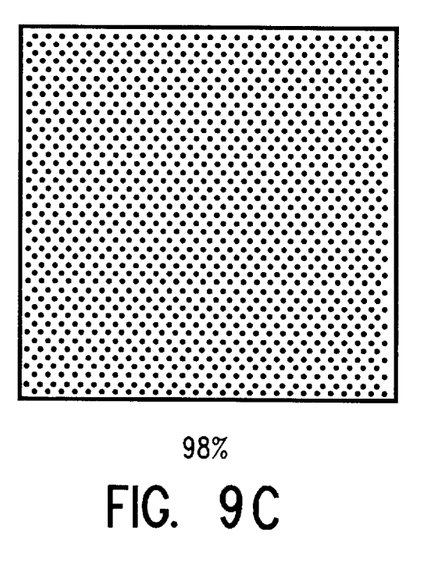

FIG. 9C shows the pattern of a mask feature which is 98% transparent in that 98% of the electrons in a beam pass through the material with little or no scattering.

Figure 9D:
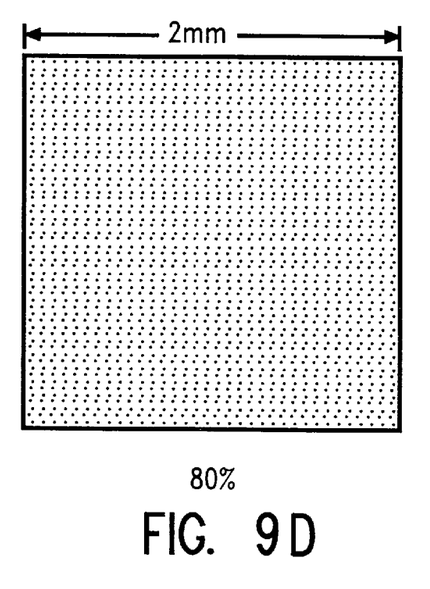

FIG. 9D shows the pattern of a mask feature which is 80% transparent in that 80% of the electrons in a beam pass through the material with little or no scattering. As can be seen in this case, there are many more subresolution scattering elements in the pattern of this mask feature.

The elements of FIGS. 9A to 9D are portions of a develop monitor test pattern for a "SCALPEL" type mask consisting of a string of 2 nm×2 nm subfields of continuously decreasing doses. The 100% dose subfield is entirely 'open' (transparent), but 100 nm square regions of scattering material in subsequent mask subfields reduce the dose at the wafer. The 25 nm features (4:1 reduction) are not resolved. Twenty-six subfields thus have a dose incrementally varying within the range between about 75% and about 100% in 1% increments. The percentage of dose reduction is set by the concentration of the non-printing features. Nominal development will not correspond to a dose of 100% since the desired 100 nm–250 nm features on the wafer will likely clean out more slowly than the large 0.5 mm "blackouts", that make up the development monitor test pattern. Thus, if the proper development for the critical small features occurred when the 90% dose subfield blockout cleared, but with some resist residue in the 89% dose subfield, this is the "full" development criterion for that process.

For stencil masks the problem is more difficult, but the idea is implemented as follows. Open areas here, are truly open. The reduced dose subfields consist of open areas with a lattice of features which again are too small to be resolved on the wafer. For example, the 90% dose subfield consist of 1.9 $\mu$m open areas on a 2 $\mu$m periodicity and the 95% dose subfield consists of 3.9 $\mu$m open areas on a 4 $\mu$m periodicity.

Industrial Applicability

The basic concept of reducing the electron exposure dose to compensate for proximity exposure is applicable to all forms of electron beam lithography. The specific use of subresolution scattering features in the projection mask is applicable to both scattering mask E-beam projection lithography and stencil mask E-beam projection lithography.

The basic concept of incorporating unresolvable features on a mask in order to create an incremental dose stripe (develop monitor test pattern) is applicable to optical, x-ray and/or ion beam projection lithography tools.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A lithographic projection system for projecting electrons along a path through a lens system and through an aperture in a back focal plane filter for electrons, said projected electrons producing a patterned image and an amount of desired electron radiation on a target, said transmission path including;

a source of electron beam radiation of electrons directed at a resist coated substrate as a target, a pattern-defining mask that contains pattern elements including an array of uniformly distributed subresolution scattering features thereon provided to produce the desired degree of scattering in said radiation of electrons between said source and said target scattered sufficiently at least some of said electrons are not passed through said aperture in said back focal plane filter, said subresolution scattering features varying in density as an direct function of predicted proximity exposure wherein said mask includes a number N of said subresolution scattering features comprising:

$$N = (1-D)\left(\frac{1w}{Z_l}\right)_{Z_w}$$

where

D≡Desired Dose (relative to 1.0 or 100%)
l≡Length of Macroscopic Pattern Feature
w≡Width of Macroscopic Pattern Feature
SSF's≡Scattering Features
$Z_l$≡Nominal length
$Z_w$≡width of Scattering Features (SSF's)
N≡Total Number of SSF's Required, with a spacing x in the x-direction and a spacing y in the y-direction comprising:

$$x = \frac{w}{N_x + 1}$$

$$y = \frac{w}{N_y + 1}$$

where x≡x spacing of SSF
y≡y spacing of SSF
$n_x$≡Number of SSF's in x direction
$n_y$≡Number of SSF's in y direction
$N_x$≡$n_x$ rounded up to next number
$N_y$≡$n_y$ rounded up to next number.

2. A lithographic projection method comprising:

projecting a beam of electrons from a source along a transmission path and through a lens system and an opaque back focal plane filter for said electrons said back focal plane filter having a transparent aperture permitting said electrons to pass through said aperture to produce a patterned image of a given quantity of said electrons on a target comprising a substrate coated with resist, said beam of electrons being focussed to pass through said aperture, placing between said source and said target a pattern-defining scattering mask including a plurality of regions, said mask containing pattern elements including an array of a plurality of subresolution scattering features thereon, provided to produce the desired degree of scattering of at least some of said electrons between said source and said target scattered sufficiently so that such scattered electrons are not passed through said aperture in said back focal plane filter, said subresolution scattering features being formed in said array of said subresolution elements uniformly distributed across said mask and varying in density for modulation of transparency of said mask to produce the desired degree of scattering of said electrons, said subresolution scattering features being adapted for scattering said electrons sufficiently that the scattered electrons are prevented from passing through said aperture of said back focal plane filter in order to reduce the electron exposure to compensate for proximity exposure.

3. A method in accordance with claim 2 including a number N of said subresolution scattering features comprising:

$$N = (1 - D)z_l \left( \frac{1w}{Z_w} \right)$$

where
D=Desired Dose (relative to 1.0 or 100%)
l=Length of Macroscopic Pattern Feature
w=Width of Macroscopic Pattern Feature
SSF's=Scattering Features
$Z_l$=Nominal length
$Z_w$=width of Scattering Features (SSF's)
N=Total Number of SSF's Required,
with a spacing x in the x-direction and a spacing y in the y-direction comprising:

$$x = \frac{w}{N_x + 1}$$

$$x = \frac{w}{N_x + 1}$$

$$y = \frac{w}{N_y + 1}$$

where
x=x spacing of SSF
y=y spacing of SSF
$n_x$=Number of SSF's in x direction
$n_y$=Number of SSF's in y direction
$N_x$=$n_x$ rounded up to next number
$N_y$=$n_y$ rounded up to next number.

4. A method in accordance with claim 2 wherein said subresolution scattering features are used to create test patterns providing dose modulation.

5. A method in accordance with claim 4 wherein said test patterns comprise a development monitoring test pattern.

6. A method in accordance with claim 2 wherein said pattern-defining mask comprises:

a wafer thin silicon substrate with a top surface covered with a thin transparent membrane, said plurality of subresolution scattering features formed on said membrane comprising thin metal film elements in the form of an array of round dots uniformly distributed over said membrane.

7. A method in accordance with claim 6 wherein said metal film comprises a metal selected from the group consisting of gold, chromium, tungsten, tantalum metals, and combinations of layers of said metals.

8. A method in accordance with claim 7 wherein said metal film has a thickness sufficient to be nontransparent.

9. A method in accordance with claim 8 wherein said subresolution scattering features are used to create test patterns using dose modulation.

10. A method in accordance with claim 9 wherein said test patterns comprise a development monitoring test pattern.

11. A method in accordance with claim 6 wherein
said membrane comprises a material selected from the group consisting of silicon, silicon nitride, silicon carbide, and diamond, and
said membrane has a thickness between about 100 nm and about 2000 nm.

12. A method in accordance with claim 2 wherein said subresolution scattering features varying in density as a direct function of predicted proximity exposure.

13. A method in accordance with claim 2 wherein said pattern-defining mask comprises:
a wafer thin silicon substrate with a top surface covered with a thin transparent membrane,
said plurality of subresolution scattering features formed on said membrane comprising thin metal film elements in the form of an array of round dots uniformly distributed over said membrane,
said subresolution scattering features varying in density as a direct function of predicted proximity exposure,
said membrane comprises a material selected from the group consisting of silicon, silicon nitride, silicon carbide, and diamond, and
said membrane has a thickness between about 100 nm and about 2000 nm.

14. A method in accordance with claim 13 wherein said thin metal film comprises a metal selected from the group consisting of gold, chromium, tungsten, tantalum, and combinations of layers thereof.

15. A system in accordance with claim 14 wherein said thin metal film comprises a metal selected from the group consisting of gold, chromium, tungsten, tantalum and combinations of layers thereof.

16. A method in accordance with claim 2 wherein said pattern-defining mask comprises:
a wafer thin silicon substrate with a top surface covered with a thin transparent membrane,
said plurality of subresolution scattering features formed on said membrane comprising thin metal film elements in the form of an array of round dots uniformly distributed over said membrane,
said subresolution scattering features varying in density as a direct function of predicted proximity exposure, said subresolution scattering features having a diameter of less than about 50 nm and spaced apart by less than or equal to about 300 nm,
said membrane comprises a material selected from the group consisting of silicon, silicon nitride, silicon carbide, and diamond, and said membrane has a thickness between about 100 nm and about 2000 nm, and said thin metal film comprises a metal selected from the group consisting of gold, chromium, tungsten, tantalum, and combinations of layers thereof.

17. A lithographic projection system including:

a source of a beam of electrons, a mask, a lens system, a back focal plane filter, and a target, said back focal plane filter being opaque to said beam of electrons except that said back focal plane filter includes an aperture which is transparent to said electrons, said system including means for projecting said electrons along a transmission path and through said lens system, through said mask and through said aperture in said opaque back focal plane filter towards said target, said target comprising a substrate coated with resist, said mask including thereon pattern-defining elements adapted for producing a pattern on said target and said mask including between said pattern elements an array of a plurality of subresolution scattering features uniformly distributed and varying in density on said mask to produce the desired degree of scattering of at least some of said electrons sufficiently such that they are not passed through said aperture in said back focal plane filter in order to reduce the electron exposure to compensate for proximity exposure, said lens system, said scattering mask, and said opaque back focal plane filter being located between said source of electrons and said target, said mask producing a patterned image and a desired quantity of electrons on said target, said said scattering mask being located between said source of said beam of electrons and said back focal plane filter.

18. A system in accordance with claim 17 wherein said subresolution scattering features comprise means for providing dose modulation test patterns.

19. A system in accordance with claim 17 wherein said subresolution scattering features comprise means for providing dose modulation test patterns wherein said test patterns comprise development monitoring test pattern elements.

20. A system in accordance with claim 17 wherein pattern-defining mask comprises:

a wafer thin silicon substrate with a top surface covered with a thin transparent membrane, said plurality of subresolution scattering features formed on said membrane comprising a thin metal film.

21. A system in accordance with claim 20 wherein said thin metal film comprises a metal selected from the group consisting of gold, chromium, tungsten, tantalum, and combinations of layers thereof.

22. A system in accordance with claim 21 wherein said metal has a thickness sufficient to be nontransparent.

23. A system in accordance with claim 22 wherein said subresolution scattering features comprise means for providing dose modulation test patterns.

24. A system in accordance with claim 23 wherein said test patterns comprise means for providing test patterns for development monitoring.

25. A system in accordance with claim 20 wherein:

said subresolution scattering features are uniformly distributed array of round dots, said membrane comprises a material selected from the group consisting of silicon, silicon nitride, silicon carbide, and diamond, and said membrane has a thickness between about 100 nm and about 2000 nm.

26. A system in accordance with claim 17 wherein said subresolution scattering features varying in density as an direct function of predicted proximity exposure.

27. A system in accordance with claim 17 wherein said pattern-defining mask comprises:

a wafer thin silicon substrate with a top surface covered with a thin transparent membrane, said plurality of subresolution scattering features formed on said membrane comprising thin metal film elements in the form of an array of round dots uniformly distributed over said membrane, said subresolution scattering features varying in density as a direct function of predicted proximity exposure, said membrane comprises a material selected from the group consisting of silicon, silicon nitride, silicon carbide, and diamond, and said membrane has a thickness between about 100 nm and about 2000 nm.

28. A method in accordance with claim 17 wherein said pattern-defining mask comprises:

a wafer thin silicon substrate with a top surface covered with a thin transparent membrane, said plurality of subresolution scattering features formed on said membrane comprising thin metal film elements in the form of an array of round dots uniformly distributed over said membrane, said subresolution scattering features varying in density as a direct function of predicted proximity exposure, said subresolution scattering features having a diameter of less than about 50 nm and spaced apart by less than or equal to about 300 nm, said membrane comprises a material selected from the group consisting of silicon, silicon nitride, silicon carbide, and diamond, said membrane has a thickness between about 100 nm and about 2000 nm, and said thin metal film comprises a metal selected from the group consisting of gold, chromium, tungsten, tantalum, and combinations of layers thereof.

* * * * *